(12) United States Patent
Lee

(10) Patent No.: US 7,375,016 B2
(45) Date of Patent: May 20, 2008

(54) METHOD FOR FABRICATING SEMICONDUCTOR DEVICE

(75) Inventor: Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 161 days.

(21) Appl. No.: 11/321,594

(22) Filed: Dec. 30, 2005

(65) Prior Publication Data

US 2006/0216885 A1    Sep. 28, 2006

(30) Foreign Application Priority Data

Mar. 22, 2005    (KR)    ............... 10-2005-0023507

(51) Int. Cl.
*H01L 21/3205*    (2006.01)
*H01L 21/4763*    (2006.01)

(52) U.S. Cl. .............. 438/589; 257/E27.091; 438/270; 438/424

(58) Field of Classification Search    257/E21.548–549, 257/E27.091; 438/587–589
See application file for complete search history.

(56) References Cited

U.S. PATENT DOCUMENTS

| 7,094,644 B2 | 8/2006 | Kim | 438/259 |
|---|---|---|---|
| 7,163,865 B2 | 1/2007 | Kim | 438/270 |
| 7,189,605 B2 * | 3/2007 | Lee | 438/200 |
| 2004/0137667 A1 | 7/2004 | Ogawa | 438/142 |
| 2007/0241420 A1 * | 10/2007 | Choi | 257/506 |

FOREIGN PATENT DOCUMENTS

KR    1020050027294 A    3/2005

OTHER PUBLICATIONS

J.Y. Kim et al., "The Breakthrough in data retention time of DRAM using Recess-Channel-Array Transistor(RCAT) for 88nm feature size and beyond", 2003 Symposium on VLSI Technology Digest of Technical Papers, pp. 11-12.

* cited by examiner

*Primary Examiner*—Thao X. Le
*Assistant Examiner*—Kimberly Trice
(74) *Attorney, Agent, or Firm*—Townsend and Townsend and Crew LLP

(57) ABSTRACT

Disclosed herein is a method for fabricating a memory device. According to the present invention, during an etching process for forming a recess gate region, a device isolation film is etched using a mask partially exposing a channel region and its neighboring device isolation film, and then a semiconductor substrate is etched, thus preventing a silicon horn in the recess gate region from being formed. Accordingly, a margin for the etching process is increased.

11 Claims, 10 Drawing Sheets

(i)  (ii)

(i)  (ii)

(i)  (ii)

(i)  (ii)

METHOD FOR FABRICATING SEMICONDUCTOR DEVICE

BACKGROUND OF THE INVENTION

1. Field of the Invention

The present invention relates to fabricating a memory device. In particular, the present invention provides a method for fabricating a semiconductor device, and more specifically to a method for fabricating a semiconductor device wherein during an etching process for forming a recess gate region, a device isolation film is etched using a mask partially exposing a channel region and its neighboring device isolation film, and then a semiconductor substrate is etched to prevent a silicon horn in the recess gate region from being formed, thus increasing a margin for the etching process.

2. Discussion of the Related Art

FIG. 1 is a simplified layout of one semiconductor device.

Referring to FIG. 1, a device isolation film 40, an active region 10a and a gate structure 120 as a word line passing across the active region 10a are formed on a semiconductor substrate. A distance between the neighboring gate structures 120 is F, which is the minimum line width according to the design rules. A line-type recess gate region 60 is disposed under the gate structure 120. The line width of the recess gate region 60 is 2D smaller than that of the gate structure 120. That is, a misalignment margin of the recess gate region 60 is D.

FIGS. 2A through 2F are simplified cross-sectional views illustrating a conventional method for fabricating a semiconductor device, wherein FIGS. 2A(i) through 2F(i) are cross-sectional views taken along the line I-I' of FIG. 1 and FIGS. 2A(ii) through 2F(ii) are cross-sectional views taken along the line II-II' of FIG. 1.

Referring to FIG. 2A, a pad oxide film 20 and a pad nitride film 30 are deposited on a semiconductor substrate 10. Next, a device isolation film 40 defining an active region 10a is formed by performing an STI process.

Referring to FIG. 2B, the device isolation film 40 is etched to lower the height of the device isolation film 40. The pad nitride film 30 is then removed. Next, a polysilicon layer 50 is formed on the entire surface.

Referring to FIG. 2C, a photoresist film (not shown) is formed on the polysilicon layer 50, and then exposed and developed using an exposure mask defining the recess gate region 60 of FIG. 1 to form a line-type mask pattern (not shown) exposing the recess gate region 60. Next, the exposed polysilicon layer 50 and the pad oxide film 20 are etched using the mask pattern as an etching mask to form a polysilicon layer pattern 50a and a pad oxide film pattern 20a defining the recess gate region 60. Thereafter, the mask pattern is removed.

Referring to FIG. 2D, the exposed semiconductor substrate 10 is etched using the polysilicon layer pattern 50a as an etching mask to form a recess gate region 70. Here, the etching process may be performed to simultaneously etch the semiconductor substrate 10 and the polysilicon layer pattern 50a. At this time, the etching rate of the semiconductor substrate 10 closest to the device isolation film 40 is slower than that of the semiconductor substrate 10 spaced apart from the device isolation film 40, thereby forming a silicon horn 'A' on the semiconductor substrate 10 within the recess gate region 70. Next, the pad oxide film pattern 20a is removed.

Referring to FIG. 2E, a gate oxide film 80 is formed on the surface of the exposed semiconductor substrate 10. Thereafter, a lower gate electrode layer 90 filling up the recess gate region 70 is formed on the entire surface. An upper gate electrode layer 100 and a hard mask layer 110 are then sequentially deposited on the lower gate electrode layer 90.

Referring to FIG. 2F, the hard mask layer 110, the upper gate electrode layer 100 and the lower gate electrode layer 90 are patterned to form a gate structure 120 consisting of a stacked structure 120 of a lower gate electrode 90a, an upper gate electrode 100a and a hard mask layer pattern 110a.

FIG. 3 is a cross-sectional view illustrating misalignment occurring during the process of forming the recess gate region according to the conventional method for fabricating a semiconductor device.

Referring to FIG. 3, in case of misalignment occurring between a recess gate mask and a device isolation film mask by M larger than D such a maximum misalignment, the semiconductor substrate 10 of M-D between the device isolation film 40 and the polysilicon layer pattern 50a is exposed.

Accordingly, the exposed semiconductor substrate 10 as unwanted portion is abnormally etched during the etching process of FIG. 2D. As the size of the semiconductor device is reduced, the process margin for manufacturing the semiconductor device is also reduced. If the misalignment is increased, a problem occurs in which the unwanted semiconductor substrate shown in FIG. 3 is exposed and then abnormally etched. In addition, the silicon horn within the recess gate region is formed to lower the threshold voltage for a cell transistor and increase its leakage current, thus degrading the refresh characteristic of the device.

SUMMARY OF THE INVENTION

According to the present invention, techniques for fabricating a memory device are provided. In particular, the present invention provides a method for fabricating a semiconductor device. More specifically, the present invention provides a method for fabricating a semiconductor device wherein during an etching process for forming a recess gate region, a device isolation film is etched using a mask partially exposing a channel region and its neighboring device isolation film, and then a semiconductor substrate is etched to prevent a silicon horn in the recess gate region from being formed, thus increasing a margin for the etching process. Although the present invention has been applied to a specific memory device, there can be other applications.

In order to achieve the above advantage, in an embodiment of the present invention, a method for fabricating a semiconductor device includes (a) forming a device isolation film defining an active region by performing a STI process on a pad insulating film formed on a semiconductor substrate, (b) forming a polysilicon layer on the entire surface of the resultant, (c) defining an island-type recess region passing across the active region, and then etching the polysilicon layer, the pad insulating film and the device isolation film in the recess region by a predetermined thickness to form a recess exposing the sidewalls of the active region, wherein a width of the island-type recess region is smaller than a line width of a gate region in a longitude direction of the active region and a width of the island-type recess region is lager than a line width of the active region in a longitude direction of the gate region, (d) etching the semiconductor substrate within the recess using the remaining polysilicon layer as an etching mask to form a recess gate region, wherein the polysilicon layer and the semiconductor substrate are simultaneously etched, (e) removing the pad insulating film by a predetermined thickness, and then forming a gate oxide film on the active region, (f) forming a lower gate conductive layer filling up the recess gate region on the entire surface of the resultant and sequentially forming a upper gate conductive layer and a hard mask layer on the lower gate conductive layer, and (g) selectively etching the hard mask layer, the upper gate conductive layer and the lower gate conductive layer using a gate mask to form a gate structure.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1:
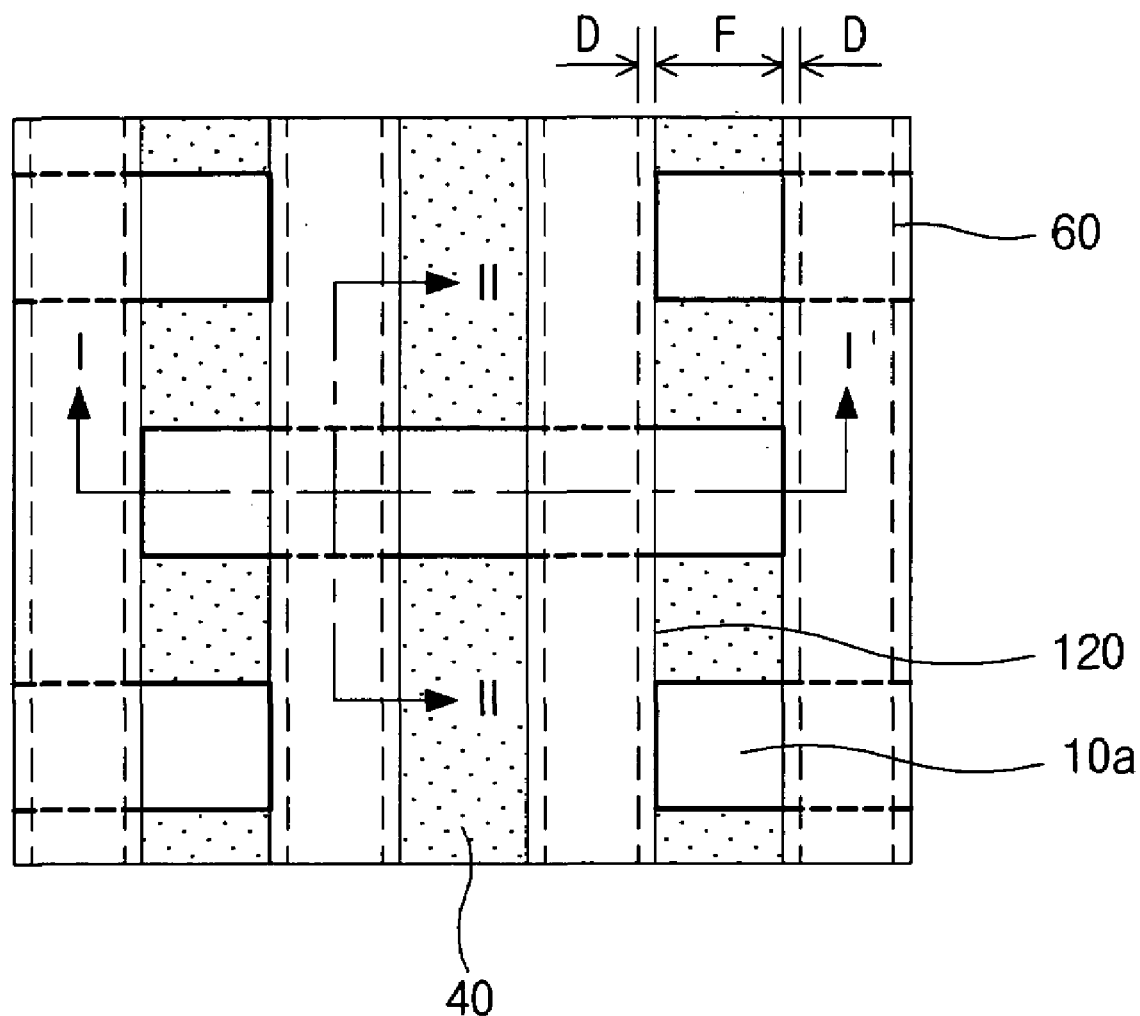
FIG. 1 is a simplified layout of a semiconductor device.
Figure 2A:
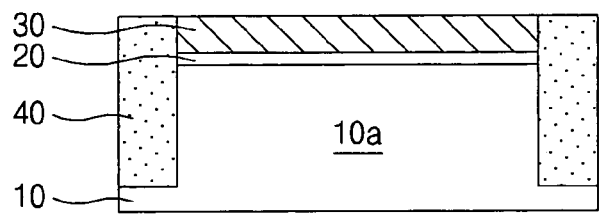
FIGS. 2A through 2F are simplified cross-sectional views illustrating a method for fabricating a semiconductor device.
Figure 2A:
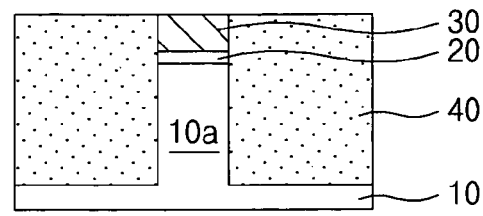
Figure 2B:
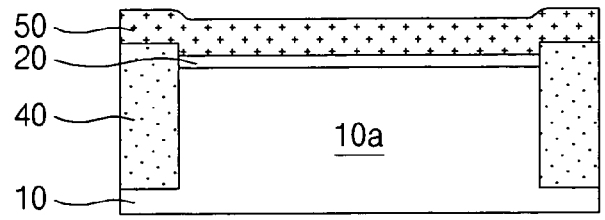
Figure 2B:
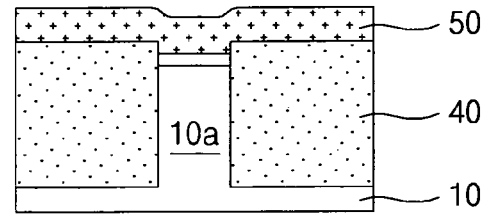
Figure 2C:
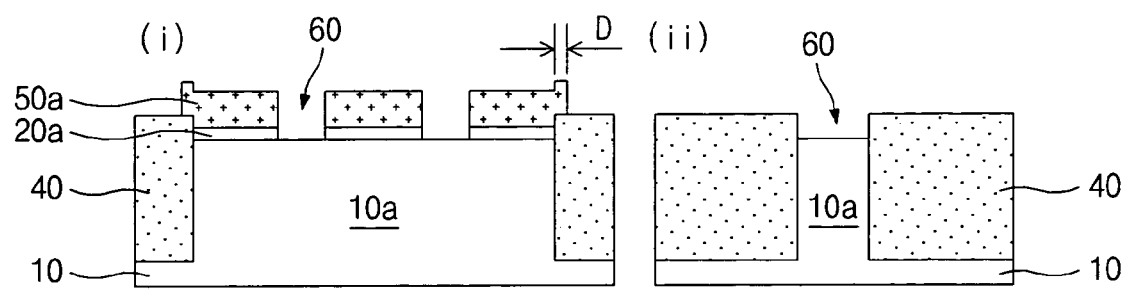
Figure 2D:
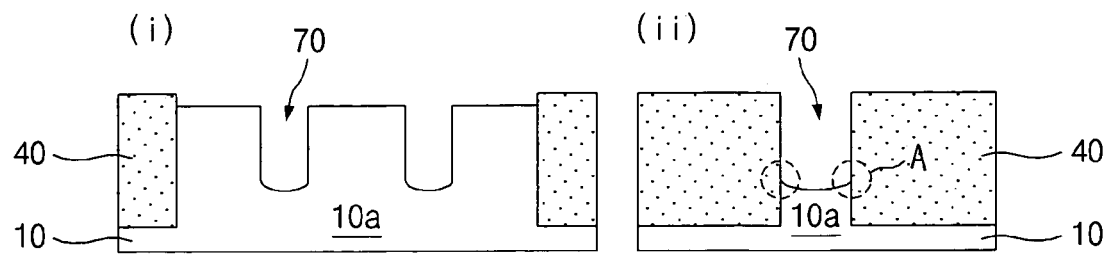
Figure 2E:
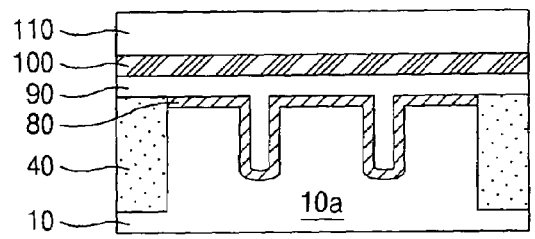
Figure 2E:
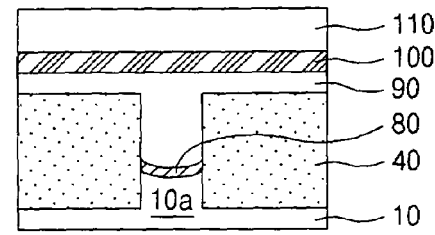
Figure 2F:
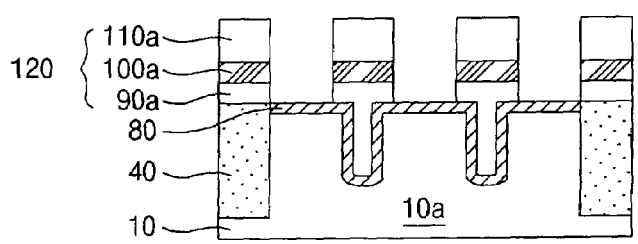
Figure 2F:
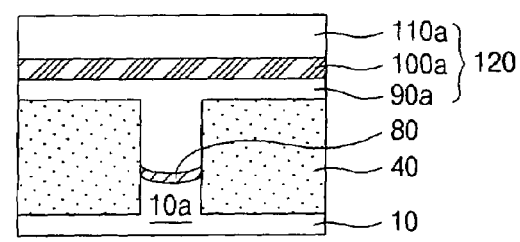
Figure 3:
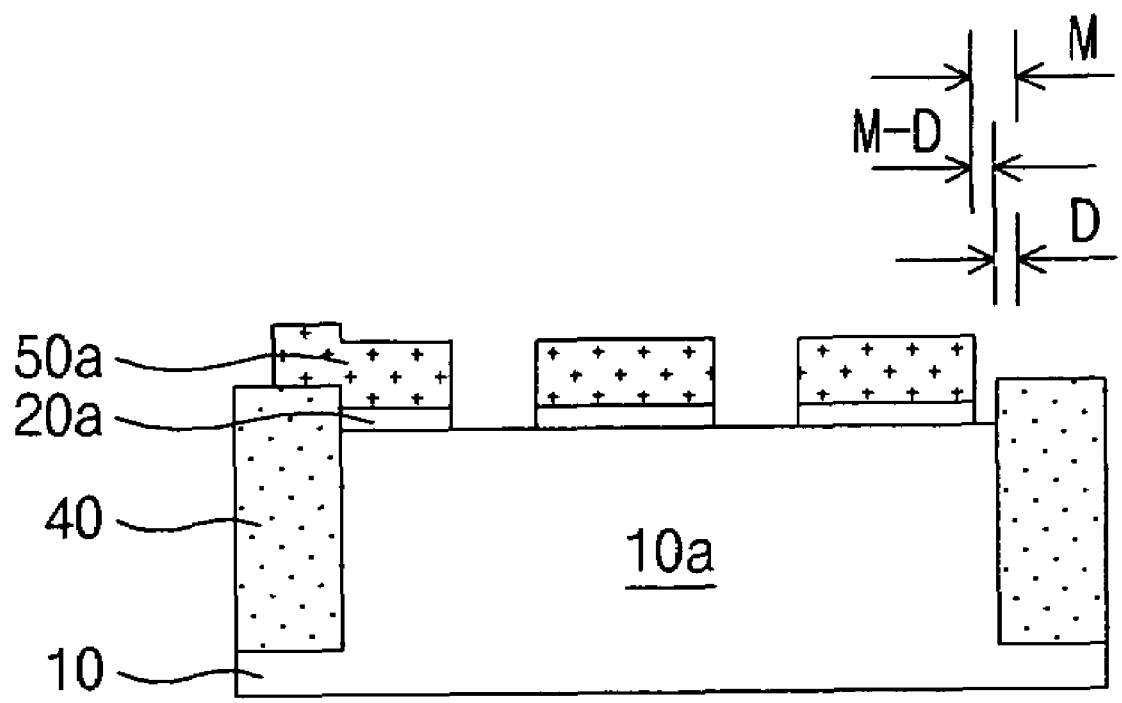
FIG. 3 is a simplified cross-sectional view illustrating misalignment in accordance with a method for fabricating a semiconductor device.
Figure 4:
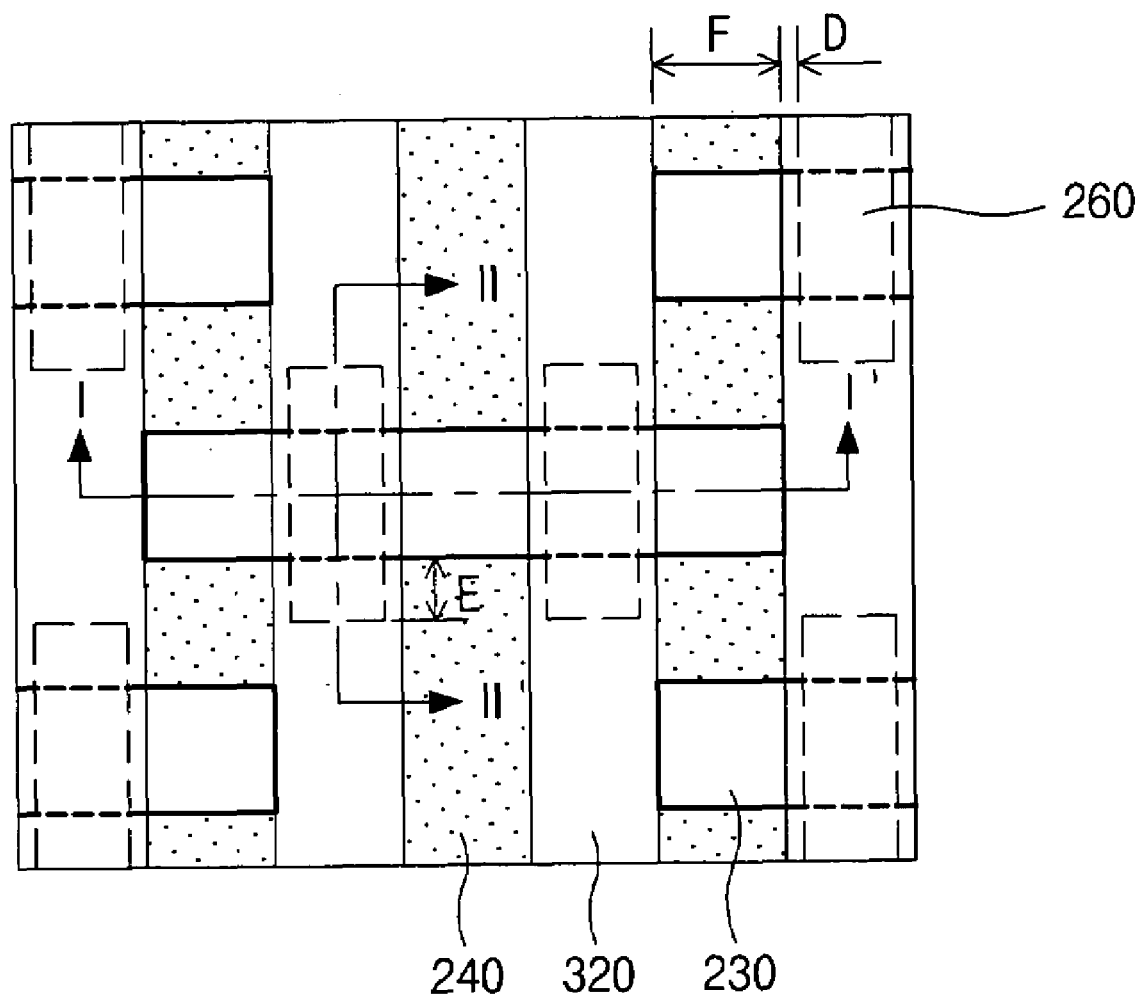
FIG. 4 is a simplified layout view of a semiconductor device in accordance with an embodiment of the present invention.

FIG. 4 is a simplified layout view of a semiconductor device in accordance with an embodiment of the present invention.

Referring to FIG. 4, a device isolation film 240, an active region 230 and a gate structure 320 such as a word line passing across the active region 230 are formed on a semiconductor substrate. A distance between the neighboring gate structures 320 is F, which is a minimum line width according to the design rules. An island type recess region 260 instead of a line-type recess region is disposed under the gate structure 320. Preferably, the width of the recess region 260 in a longitudinal direction of the active region 230 is 2D smaller than a line width of the gate structure 320 and the height of the recess region 260 in a longitudinal direction of the gate structure 320 is 2E larger than a line width F of the active region 200a by 2E, where $0 \leq D \leq (\frac{1}{3})F$ and $0 \leq E \leq (\frac{1}{2})F$.

Figure 5A:
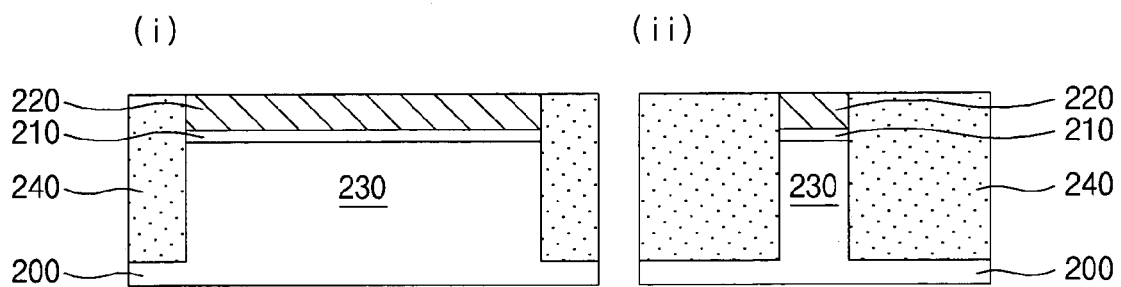
FIGS. 5A through 5F are simplified cross-sectional views illustrating a method for fabricating a semiconductor device in accordance with an embodiment of the present invention.

FIGS. 5A through 5F are simplified cross-sectional views illustrating a method for fabricating a semiconductor device according to an embodiment of the present invention, wherein FIGS. 5A(i) through 5F(i) are simplified cross-sectional views taken along the line I-I' of FIG. 4 and FIGS. 5A(ii) through 5F(ii) are simplified cross-sectional views taken along the line II-II' of FIG. 4.

Referring to FIG. 5A, a pad oxide film 210 and a pad nitride film 220 are sequentially formed on a semiconductor substrate 200. Next, an STI process is performed in order to form a device isolation film 240. In particular, a predetermined region of the pad nitride film 220, the pad oxide film 210 and the semiconductor substrate 200 are sequentially etched by a predetermined thickness to form a trench for device isolation (not shown). Next, an insulating film (not shown) filling up the trench for device isolation is formed on the entire surface, and the insulating film is then polished using a CMP process until the pad nitride film 220 is exposed to form a device isolation film 240 defining the active region 230. Here, a thermal oxide film (not shown) may be formed at the interface between the semiconductor substrate 200 and the device isolation film 240. Further, a liner nitride film (not shown) may be formed at the interface between the device isolation film 240 and the thermal oxide film.

Figure 5B:
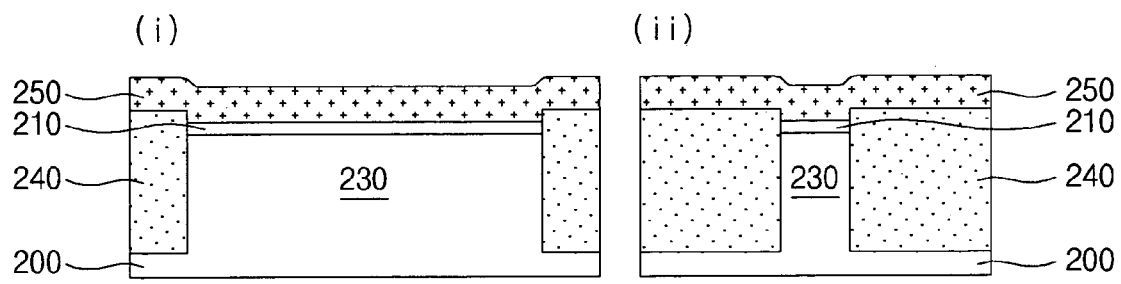

Referring to FIG. 5B, the device isolation film 240 is etched by a predetermined thickness to lower its height, and then the pad nitride film 220 is removed. Next, a polysilicon layer 250 is formed on the entire surface. At this time, the pad oxide film 210 may be removed and a buffer oxide film (not shown) may be formed on the surface of the exposed semiconductor substrate 200 after the pad nitride film 220 is removed. The active region 230 may then be subjected to a well and channel ion implant process. In addition, the active region 230 may be subjected to a well and channel ion implant process after the pad nitride film 220 is removed. Next, the pad oxide film 210 is removed, and then a buffer oxide film (not shown) may be formed on the surface of the exposed semiconductor substrate 200.

Figure 5C:
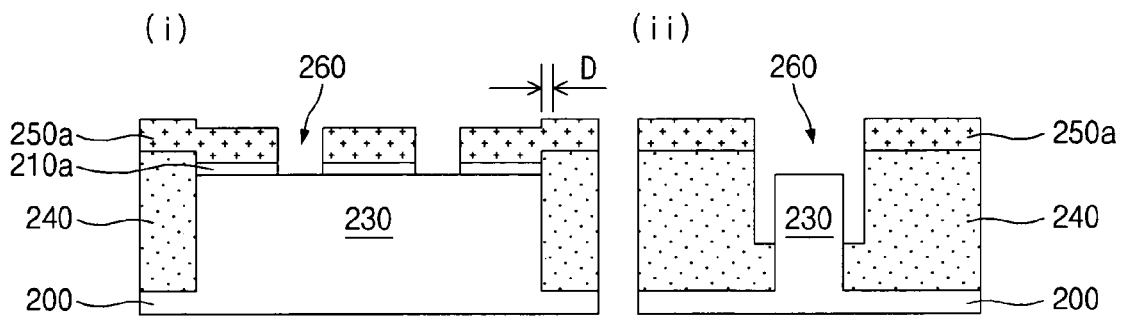

Referring to FIG. 5C, a nitride film pattern (not shown) defining a gate region is formed on the polysilicon layer 250. Next, a photoresist film (not shown) is formed on the entire surface, and then exposed and developed using a mask (not shown) defining a recess region 260 shown in FIG. 4 to form a photoresist film pattern (not shown) exposing the recess region 260. That is, the photoresist film pattern is formed to expose the recess region 260 within the nitride film pattern, wherein a width of the recess gate region 260 is 2D smaller than the line width of a gate structure 320 shown in FIG. 4 in a longitudinal direction of the active region 230 and a width of the recess region 260 is 2E lager than the line width of the active region 230 in a longitudinal direction of the gate structure 320. The photoresist film pattern partially exposes the polysilicon layer 250 in a channel region and the device isolation film 240 adjacent to the channel region.

Thereafter, the exposed polysilicon layer 250, the pad oxide film 210 underlying the polysilicon layer 250 and the device isolation film 240 are etched using the photoresist film pattern by a predetermined thickness to form a polysilicon layer pattern 250a and a pad oxide film pattern 210a defining the recess region 260. A recess (not shown) is formed by etching the device isolation film 240 to expose the sidewalls of the active region 230. Here, a thickness of the etched device isolation film 240 can be preferably adjusted according to a depth of the semiconductor substrate 200 etched by the etching process for the semiconductor substrate 200 shown in following FIG. 5D. After that, the photoresist film pattern and the nitride film pattern are removed.

Figure 5D:
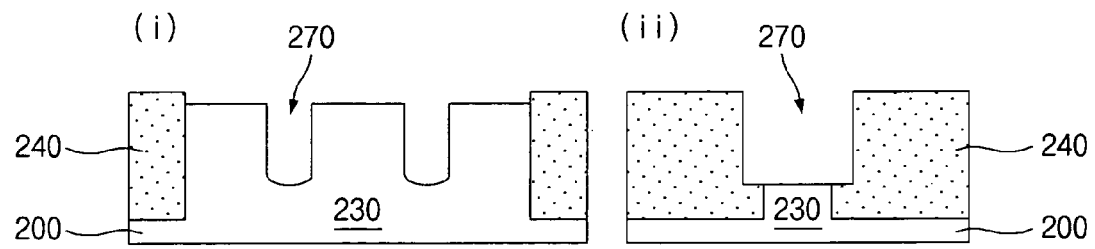

Referring to FIG. 5D, the semiconductor substrate 200 exposed by the etching process of FIG. 5C is etched using the polysilicon layer pattern 250a as an etching mask to form a recess gate region 270. Here, a thickness of the etched semiconductor substrate 200 is more preferably equal to or larger than that of the etched device isolation film 240 by the etching process for the device isolation film 240 shown in FIG. 5C. In addition, the semiconductor substrate 200 and the polysilicon layer pattern 250a are preferably etched at the same time. In the present invention, after the device isolation film 240 is etched, the semiconductor substrate 200 is etched to prevent a silicon horn from being formed. Since the device isolation film and the semiconductor substrate are simultaneously etched according to the conventional method for manufacturing a semiconductor device, the silicon horn is formed in the semiconductor substrate whose etch rate is slower than that of the device isolation film. Next, the pad oxide film pattern 210a is etched by at least a predetermined thickness to remove it. Here, the pad oxide film pattern 210a may be removed completely or by a predetermined thickness.

Figure 5E:
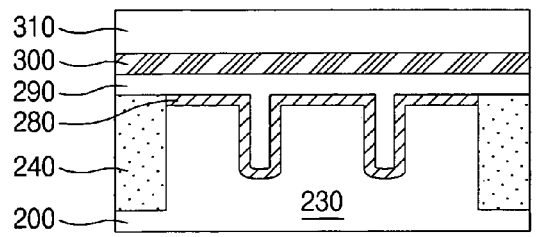
Figure 5E:
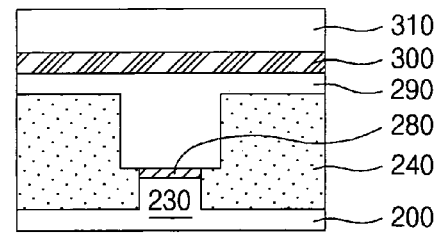

Referring to FIG. 5E, a gate oxide film 280 is formed on the surface of the exposed semiconductor substrate 200. In case of completely removing the pad oxide film pattern 210a by the etching process shown in FIG. 5D, the gate oxide film 280 is formed on the surface of the semiconductor substrate 200 including the top surface and sidewalls of the active region 230. In case of removing the pad oxide film pattern 210a by a predetermined thickness, the gate oxide film 280 is formed on the surface of the remaining pad oxide film pattern 210a and sidewalls of the active region 230. Next, a lower gate electrode layer 290 is formed on the entire surface to fill up the recess gate region 270, and then an upper gate electrode layer 300 and a hard mask layer 310 are sequentially formed on the lower gate electrode layer 290.

Figure 5F:
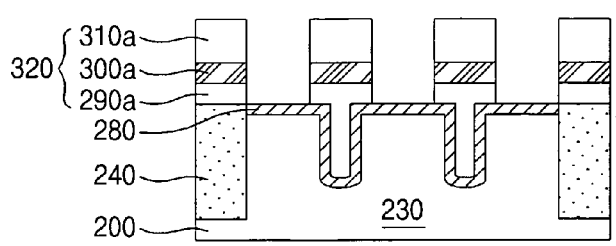
Figure 5F:
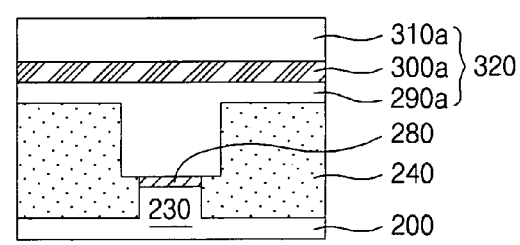

Referring to FIG. 5F, the hard mask layer 310, the upper gate electrode layer 300 and the lower gate electrode layer 290 are patterned to form a gate structure 320 consisting of a lower gate electrode 290a, an upper gate electrode 300a and a hard mask layer pattern 310a.

Figure 6:
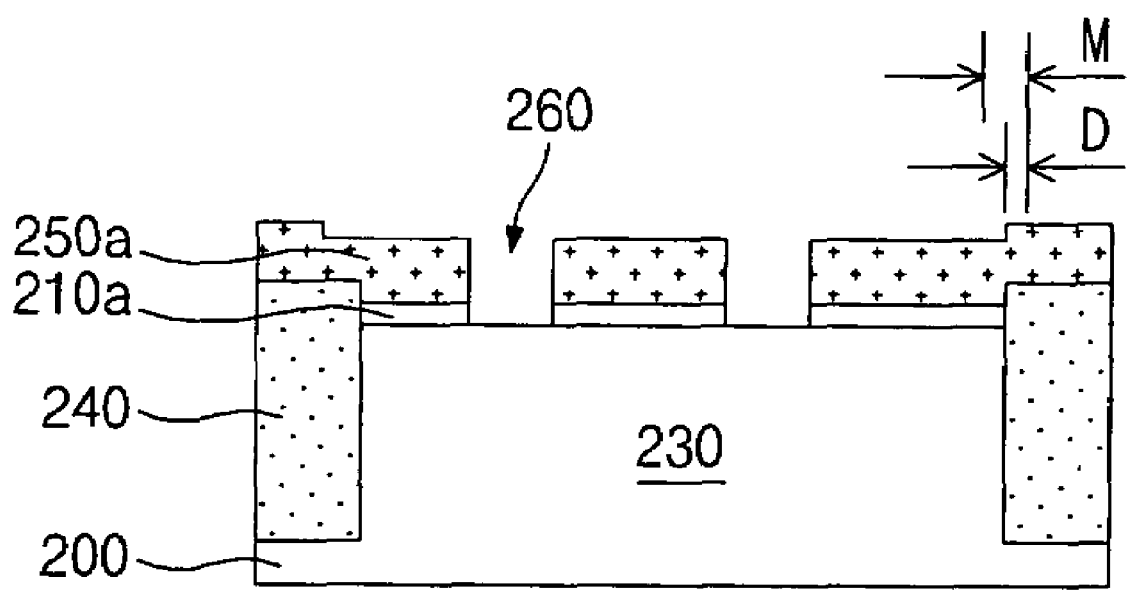
FIG. 6 is a simplified cross-sectional view illustrating misalignment in accordance with an embodiment of the present invention.

FIG. 6 is a simplified cross-sectional view illustrating misalignment occurring during the process of forming the recess gate region according to an embodiment of the present invention.

Referring to FIG. 6, in case of etching the polysilicon layer 250, the pad oxide film 210 and the device isolation film 240 in the recess region 260 using a photoresist film (not shown) as an etching mask, misalignment occurs between a recess gate mask and a device isolation film mask by M larger than D such a maximum misalignment. In a method for manufacturing a semiconductor device according to an embodiment of the present invention, since an island-type mask defining the recess gate region 260 shown in FIG. 4 serves instead of a line-type recess region during a formation process for the recess gate region 260, even though the misalignment occurs by M, the semiconductor substrate 200 is not exposed at which the recess region 260 is not, thus preventing the unwanted semiconductor substrate 200 from abnormally being etched during the etching process for the semiconductor substrate 200 shown in FIG. 5D.

As described above, according to the present invention, a device isolation film is etched using a mask to partially expose a channel region and its neighboring device isolation film during the etching process of the recess gate region, and then a semiconductor substrate is etched to form the recess gate region. Accordingly, a silicon horn in the recess gate region is prevented from being formed to reduce leakage current of a cell transistor, thereby improving the refresh characteristic of the device. In addition, the semiconductor substrate is prevented from abnormally being etched in case of the excessive misalignment between the recess gate mask and the device isolation mask.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, comprising the steps of:
   (a) forming a device isolation film defining an active region by performing a STI process on a pad insulating film formed on a semiconductor substrate;
   (b) forming a polysilicon layer on an entire surface of the semiconductor device;
   (c) defining an island-type recess region passing across the active region, and then etching the polysilicon layer, the pad insulating film and the device isolation film by a predetermined thickness in the island-type recess region to form a recess exposing both sidewalls of the active region, wherein a width of the island-type recess region is smaller than a width of a gate region in a first direction and a length of the island-type recess region is larger than a width of the active region in a second direction
   wherein the first direction is defined in the active region and the second direction is defined in the gate region, the first direction being substantially perpendicular to the second direction;
   (d) etching the semiconductor substrate within the recess using the remaining polysilicon layer as an etching mask to form a recess gate region, wherein the polysilicon layer and the semiconductor substrate are simultaneously etched;
   (e) removing the pad insulating film by a predetermined thickness, and then forming a gate oxide film on the active region;
   (f) forming a lower gate conductive layer filling up the recess gate region on the entire surface of the semiconductor device and sequentially forming a upper gate conductive layer and a hard mask layer on the lower gate conductive layer; and
   (g) selectively etching the hard mask layer, the upper gate conductive layer and the lower gate conductive layer using a gate mask to form a gate structure.

2. The method according to claim 1, wherein step (a) includes
   etching a device isolation region of the pad insulating film and the semiconductor, substrate by a predetermined thickness to form a trench;
   forming an insulating film for a device isolation film filling up the trench on the entire surface; and
   polishing the insulating film for a device isolation film until the pad insulating film is exposed to form a device isolation film.

3. The method according to claim 1, further comprising a step of forming a thermal oxide film at a first interface between the device isolation film and the semiconductor substrate.

4. The method according to claim 3, further comprising a step of forming a liner nitride film at a second interface between the device isolation film and the thermal oxide film.

5. The method according to claim 1, after step (a), further comprising steps of:

removing the pad insulating film to expose the semiconductor substrate;

forming a buffer oxide film on the exposed semiconductor substrate; and performing a well and channel ion implant process to implant impurity ions into the active region.

6. The method according to claim 1, after step (a), further comprising steps of:

performing a well and channel ion implant process to implant impurity ions into the active region;

removing the pad insulating film to expose the semiconductor substrate; and forming a buffer oxide film on the exposed semiconductor substrate.

7. The method according to claim 1, wherein step (c) includes forming a photoresist film pattern exposing a recess region on the polysilicon layer;

selectively etching the polysilicon layer, the pad oxide film and the device isolation film in the recess region using the photoresist film pattern as an etching mask; and removing the photoresist film pattern.

8. The method according to claim 1, wherein step (c) includes forming a nitride film pattern defining a gate region on the polysilicon layer;

forming a photoresist film pattern defining a recess region on the entire surface of the semiconductor device, wherein;

selectively etching the polysilicon layer, the pad oxide film and the device isolation film in the recess region using the photoresist film pattern as an etching mask; and removing the photoresist film pattern and the nitride film pattern.

9. The method according to claim 1, wherein the width of the island-type recess region in the first direction of the active region is 2D smaller than the line width of the gate structure and the length of the island-type recess region in the second direction of the gate structure is 2E larger than the width of the active region, where $0 \leq D \leq (1/3) F$, $0 \leq E \leq (1/2) F$ and F is a distance between neighboring gate structures.

10. The method according to claim 1, wherein a thickness of the etched device isolation film in step (c) is equal to or less than that of the etched semiconductor substrate in step (d).

11. The method according to claim 1, wherein the step (e) includes etching the pad insulating film to expose the active region; and forming a gate oxide film on the exposed active region.

* * * * *